(12) United States Patent
Kishiro

(10) Patent No.: US 7,180,142 B2
(45) Date of Patent: Feb. 20, 2007

(54) SEMICONDUCTOR DEVICE

(75) Inventor: Koichi Kishiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/002,322

(22) Filed: Dec. 3, 2004

(65) Prior Publication Data

US 2005/0184347 A1  Aug. 25, 2005

(30) Foreign Application Priority Data

Feb. 25, 2004  (JP) ............................. 2004-049058

(51) Int. Cl.
*H01L 29/72* (2006.01)

(52) U.S. Cl. .................. 257/401; 257/372; 257/394; 257/618; 257/653; 257/773

(58) Field of Classification Search ............... 257/372, 257/394, 401, 618, 653, 773
See application file for complete search history.

(56) References Cited

U.S. PATENT DOCUMENTS

| 6,434,053 B1 | 8/2002 | Fujiwara |
| 2002/0001927 A1 | 1/2002 | Kawai |
| 2003/0049940 A1 | 3/2003 | Matsuhashi et al. |

*Primary Examiner*—Edward Wojciechowicz
(74) *Attorney, Agent, or Firm*—Rabin & Berdo, P.C

(57) ABSTRACT

The present invention provides a semiconductor device having an active region bent at right angles, wherein an interval between patterns for the active region and a gate is set larger than an arc radius of a curved portion (portion where a line is brought to arcuate form) formed inside the pattern for the bent active region. By defining and designing the pattern interval, the curved portion of the active region do not overlap the gate pattern, and the difference between a device characteristic and a designed value can be prevented from increasing.

6 Claims, 4 Drawing Sheets

SEMICONDUCTOR DEVICE

BACKGROUND OF THE INVENTION

1. Field of the Invention

The present invention relates to a transistor integrated circuit formed on a wafer, and particularly to a semiconductor device capable of obtaining a characteristic equivalent to a design value where an active region or a gate of a MOS transistor is a bent pattern, and a method of evaluating the semiconductor device.

2. Description of the Related Art

With the objective of speeding up a device, an SOI (Silicon On Insulator) substrate in which a thin silicon layer is formed on an insulating layer, has been in heavy usage in recent years. A method of forming a transistor on an SOI is basically similar to a process using a bulk silicon wafer.

When device isolation is carried out by a LOCOS (Local Oxidation Of Silicon) method at this time, the edges of an SOI layer provided on a buried oxide film 2 are brought to bird beaks due to a LOCOS oxide film 1 as shown in FIG. 4A. When a gate oxide film 4 is formed under such shapes and a gate 5 is formed, a parasitic transistor 7 is formed at each edge portion of an active region 3 where the gate 5 overlaps. Therefore, a transistor to be formed takes a configuration in which the parasitic transistor 7 is connected in parallel with a transistor 6 of the present device.

Since the impurity concentration of each bird beak is reduced due to ion implantation conditions, annealing in each process steps, etc., the parasitic transistor is easy to be reduced in threshold voltage as compared with the transistor of the present device. Therefore, as shown in FIG. 4B, a hump phenomenon in which humps appear, occurs in the characteristic of a drain current Id relative to a gate voltage Vg. In order to suppress the hump phenomenon, for example, ion implantation is normally effected on the bird beaks, thereby taking or carrying out countermeasures to raise a channel concentration of a parasitic transistor region and suppress the starting up or raising of the parasitic transistor.

Upon device's circuit design, a spice parameter extracted from a transistor characteristic of an evaluating TEG (Test Element Group) is used to carry out the circuit design. As shown in FIG. 3A, a transistor having simple pattern shapes in which a gate 11 and an active region 12 intersect at right angles, is used in TEG at the extraction of the parameter.

On the other hand, however, each of patterns for an active region and a gate in an actual circuit pattern cannot be configured in a simple shape like a TEG pattern. In the case of, for example, an inverter circuit or the like, it assumes a bent pattern to connect two adjacent active regions by one gate pattern.

With a view toward making a pattern layout in consideration of high integration such that elemental devices can be formed on a wafer as many as possible, such a pattern layout that a gate 13 is formed on an active region 14 having a bent shape as shown in FIG. 3B is also used.

Now, a patent document (Japanese Unexamined Patent Publication No. Hei 10(1998)-93101) has disclosed a method of providing an impurity region higher in concentration than an active region between the active region and an insulating layer to suppress a hump characteristic, thereby preventing concentration of an electric field from occurring due to etching of an insulating film at an edge portion adjacent to the active region. Further, patent documents (Japanese Unexamined Patent Publication Nos. 2002-9292 and 2003-86807) respectively have disclosed a method of performing impurity injection for suppressing turning on of a parasitic transistor on each side portion of an active region without making use of a mask using a photoresist to thereby prevent a hump characteristic.

On the other hand, when patterns for an active region having a bent shape and a gate are formed using photography, the interior of a bent portion of a photoresist's pattern do not assume the right angle as in the photomask's pattern and is curved as indicated by a portion B in FIG. 3B. When, for example, the active region is formed while maintaining the curved pattern as it is, a curved portion overlaps the gate pattern where the pattern interval between the bent active region and the gate is short. This results in the same as that a channel width became longer than a design value, and hence a transistor characteristic varies.

A section taken along line A—A of FIG. 3B is shown in FIG. 3C. An active region 14 provided on a buried oxide film 15 is isolated by a LOCOS oxide film 16, and a gate 13 is formed on a gate oxide film 17. In a transistor having an SOI structure in particular, the edge portion of an active region based on a LOCOS oxide film assumes a bird beak shape when the curved active region overlaps a gate's pattern. Therefore, a parasitic transistor region becomes wide and hence a hump phenomenon of an Id-Vg characteristic is exhibited greater.

Under such circumstances, the difference in characteristic becomes large between a transistor characteristic of an actual device and a spice parameter used in circuit design introduced from TEG so that an integrated circuit cannot obtain characteristics such as shown in circuit design. When a curved active region overlaps a gate pattern even in the case of the implantation of an impurity into an edge region, which is carried out for hump suppression where a transistor is formed in an SOI substrate, the effect of the impurity injection is not obtained and hence a hump characteristic is not improved.

SUMMARY OF THE INVENTION

Therefore, the present invention has been made in view of such problems. It is an object of the present invention to provide a semiconductor device capable of, when a pattern for an active region or a gate is bent, preventing a curved portion of the bent pattern from influencing a device characteristic and reducing a characteristic difference between the device characteristic and a design value, and a method of evaluating the semiconductor device.

According to one aspect of the present invention, for achieving the above object, there is provided a semiconductor device comprising an active region bent at right angles, and a gate formed over the active region, wherein an interval between patterns for the bent active region and the gate is larger than an arc radius (corresponding to the radius of an arc when a line is regarded as the arc) of a curved portion (corresponding to a portion where the line becomes arcuate) formed inside the pattern for the bent active region. Here, the term "at right angles" does not mean an accurate angle of 90° but means that a pattern is bent substantially at right angles (bent approximately at right angles). Also, similarly, the term "arcuate" does not mean the arc of an accurate circle but means that the line is handled as a substantially circular arc.

When a portion bent substantially at right angles exists in a mask pattern where a pattern for a photoresist is formed in a photolithography process at the formation of a device pattern, its bent inner line does not reach the right angle as defined by the mask but assumes a bent round line. The present invention aims to set a pattern interval between the active region and the gate larger than the arc radius of the portion brought to such an arcuate line thereby to obtain an effect that does not influence the characteristic.

In an integrated circuit of MOS transistors, a pattern for an active region or a gate is often bent to enhance integration density. When, for example, a curved portion of an active region pattern overlaps a gate pattern, it results in the same as that a channel width expands. Thus, a device characteristic changes into a design value. Therefore, it is desirable to define and design such an interval that the curved portion does not influence the gate pattern.

When a MOS transistor is formed in an SOI substrate in which device isolation is performed by using a LOCOS method, a large characteristic difference is apt to occur between a device characteristic and a design value due to a parasitic transistor formed at a curved portion. Therefore, the interval between the patterns for the active region and the gate is set so as not to overlap the curved portion of the active region, thereby bringing about the great effect of resolving the difference in characteristic between the design value and an actually fabricated device. Needless to say, an advantageous effect is obtained even with respect to the application of a bulk structure as well as an SOI structure to a transistor.

Further, even in the case of a semiconductor device in which a gate pattern is bent at right angles, a pattern interval between the bent gate pattern and an active region is set larger than an arc radius of a curved portion lying inside the bent gate pattern, thereby making it possible to prevent the influence of the gate's curved portion on the active region and obtain a characteristic substantially equivalent to a designed one.

In order to evaluate the characteristic of the semiconductor device having a predetermined pattern interval between such a bent active region and a gate as described above, there is provided a method of evaluating the semiconductor device comprising the steps of forming a plurality of MOS transistors different only in the pattern interval, measuring characteristics of the plurality of MOS transistors respectively, and plotting the characteristics relative to the pattern interval and defining such an interval that the characteristics do not depend on the pattern interval as a minimum pattern interval between the bent active region and the gate.

When the active region is bent substantially at right angles and a predetermined interval is defined between patterns for the active region and the gate as viewed in the direction normal to its bent direction, the semiconductor device can be evaluated by measuring a threshold voltage and a drain current. When the values of the threshold voltage and the drain current relative to the pattern interval between the active region and the gate are plotted in graph form, the characteristic varies according to the interval when the interval is small, whereas the characteristic becomes constant when the interval becomes large. That is, such an interval that the threshold voltage and the drain current become constant without depending on the interval, results in the minimum interval to allow the active region pattern and the gate pattern to be spaced away from each other.

Aside from the threshold voltage and the drain current, a leak current and/or an S value (indicative of a drain current characteristic relative to a gate voltage at less than or equal to the threshold voltage and corresponding to a gate voltage value for incrementing the drain current by one digit) are measured. Similarly, the dependence of the characteristic on the interval between the active region and the gate is determined, thereby making it possible to determine the interval to be accurately taken for separation. This evaluating pattern may be inserted into part of a wafer as TEG or may be formed over the entire surface as an evaluating wafer.

According to the present invention as described above in detail, when an active region or a gate is bent approximately at right angles, the interval between patterns for the active region and the gate is set larger than an arc radius of a substantially arcuate curved portion lying inside the pattern for the bent active region, thereby making it possible to lessen the influence of the curved portion on a device characteristic and obtain a device characteristic set as substantially designed. Therefore, it is possible to lessen feedback from trial production to design and reduce the number of man hours and cost.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
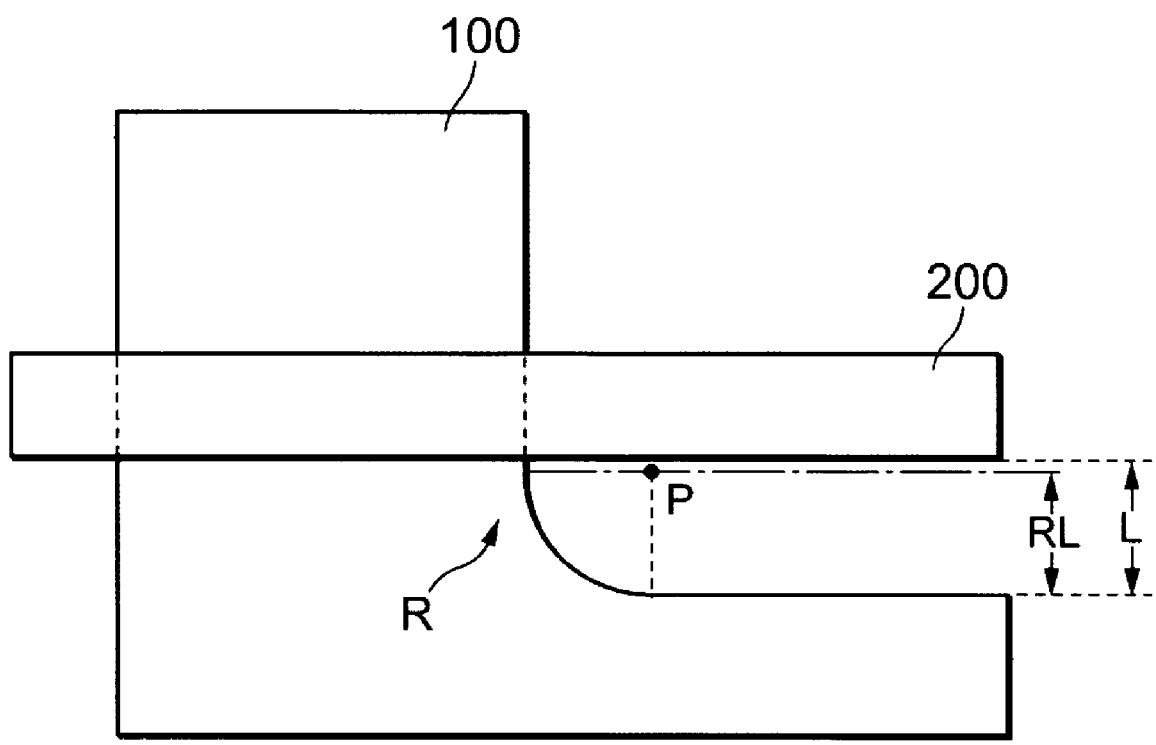
FIG. 1 is a view for describing a semiconductor device according to an embodiment of the present invention.

Preferred embodiments of the present invention will be explained hereinafter in detail with reference to the accompanying drawings. Incidentally, elements each having substantially the same functional constitution are given like reference numerals through this specification and figures, and dual explanations of the same elements will therefore be avoided.

A description will be made of a case in which an active region 100 of a MOS transistor such as shown in FIG. 1 as the present embodiment is bent at right angles. The present embodiment is characterized in that an interval L between the active region 100 and a gate 200 is made larger than an arc radius RL at an arcuate curved portion R of the active region. Here, the term "at right angles" does not mean an accurate angle of 90° but a pattern bent substantially at right angles. Also the term "arcuate" does not mean a line that accurately overlaps the arc of a circle but means that the line can be handled as a circular arc.

When circuits are intended to be integrated on a chip as many as possible, it is advantageous to set the interval L between the active region 100 and the gate 200 as short as possible. Design criteria for the interval between the active region and the gate can be determined based on alignment accuracy of photography. Allowance for each of an active region and a gate of a transistor fabricated by a 0.2 μm design rule is about 0.1 μm.

Figure 3A:
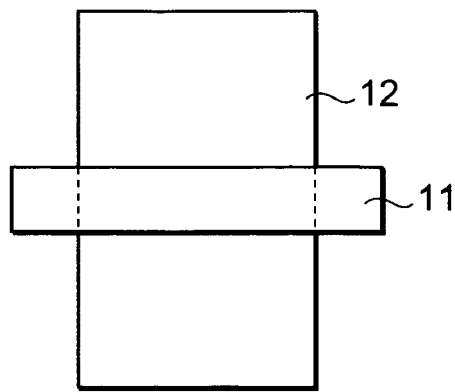
FIG. 3A is an explanatory view showing general patterns of an active region and a gate.
Figure 3B:
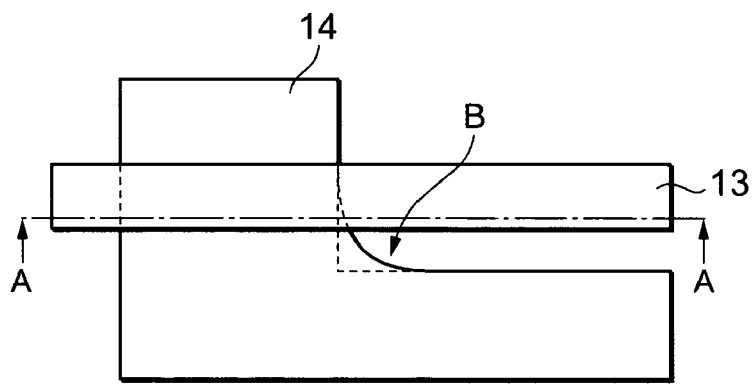
FIG. 3B is an explanatory view showing a pattern having a bent portion in an active region.
Figure 3C:
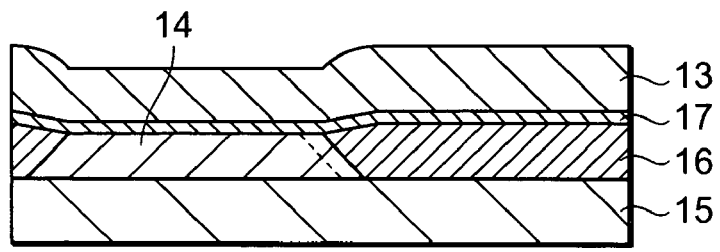
FIG. 3C is an explanatory view illustrating a section taken along line A—A of FIG. 3B.
Figure 4A:
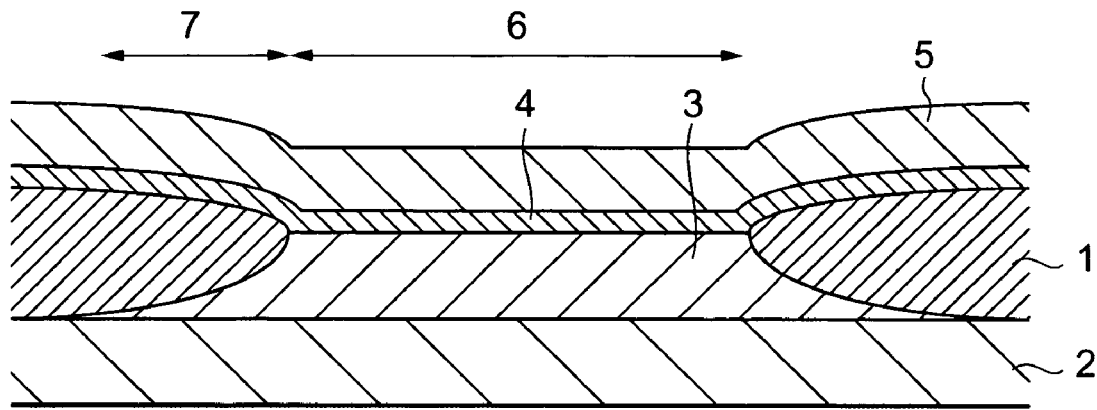
FIG. 4A is a schematic cross-sectional view showing an active region of a MOS transistor formed in an SOI substrate using a LOCOS method.
Figure 4B:
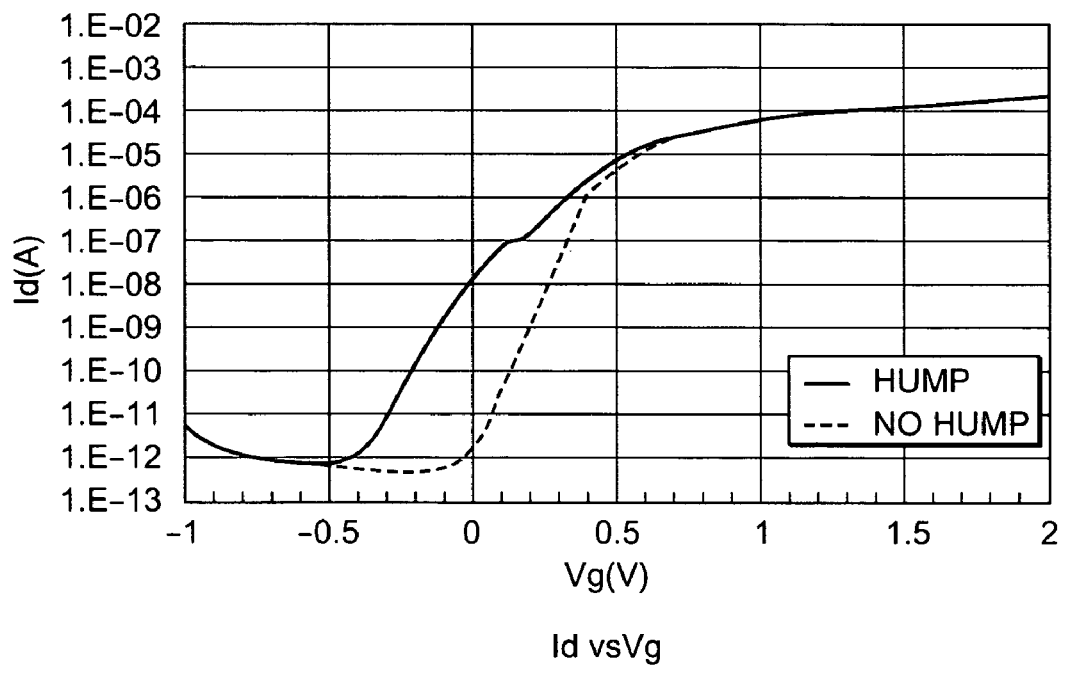
FIG. 4B is an explanatory view illustrating a hump characteristic related to drain current vs gate voltage characteristics.

However, when the active region is formed using a mask pattern bent at right angles, the interior of a photoresist's pattern is curved (curved portion R) and a pattern line thereof assumes a substantially arcuate form. Since the active region 100 having a curved form is formed as it is, the curved portion R overlaps the gate 200 as the interval L between the patterns for the active region 100 and the gate 200 becomes short (see FIG. 3B). This acts in the same manner as when a channel width expands. Thus, a device characteristic changes into a designed value.

Thus, the present embodiment aims to regard the substantially arcuate line of the curved portion as a circular art with its center as a point P, set the interval L larger than the arc radius RL so as to avoid overlapping of the curved portion R with the pattern for the gate 200 and thereby prevent a variation in characteristic. Such a minimum interval L as not to influence transistor characteristics is evaluated, and circuit design and pattern design can be performed with the provision of rules so that the device characteristic is set as designed, thereby making it possible to lessen feedback such as a correction to the designed value and reduce the number of man-hours and cost required to develop a device.

Even when the gate has a bent portion outside the active region, the pattern for the curved gate acts so as to expand a gate length, thereby varying the characteristic. Therefore, the interval between the patterns for the gate and active region is made larger than the arc radius of the curved portion in such a manner that the curved portion of the gate does not overlap the pattern for the active region, thereby making it possible to obtain the characteristic set as substantially designed.

In order to define the interval L between the active region 100 and the gate 200, a plurality of MOS transistors different only in the interval L corresponding to a predetermined interval are first formed. These transistors are used for evaluation but fabricated under the conditions similar to those for the present device. Patterns for the evaluation may be formed in an evaluating wafer but may be formed in part of a wafer for the present device as TEG patterns.

Next, the characteristics of the formed plural MOS transistors are respectively measured. When the result of measurement of their characteristics is plotted in the form of a graph with respect to the interval L, the characteristics do not depend on the interval and a constant interval can be provided as the minimum pattern interval between the active region and the gate.

When such an active region as shown in FIG. 1 is being bent, the minimum pattern interval can be defined by measuring a threshold voltage Vt and a drain current Id as the characteristics. Further, a leak current Ioff and an S value (gate voltage value for incrementing the drain current by one digit) may be measured aside from the threshold voltage Vt and the drain current Id, whereby the minimum pattern interval can be defined with a higher degree of precision.

Figure 2:
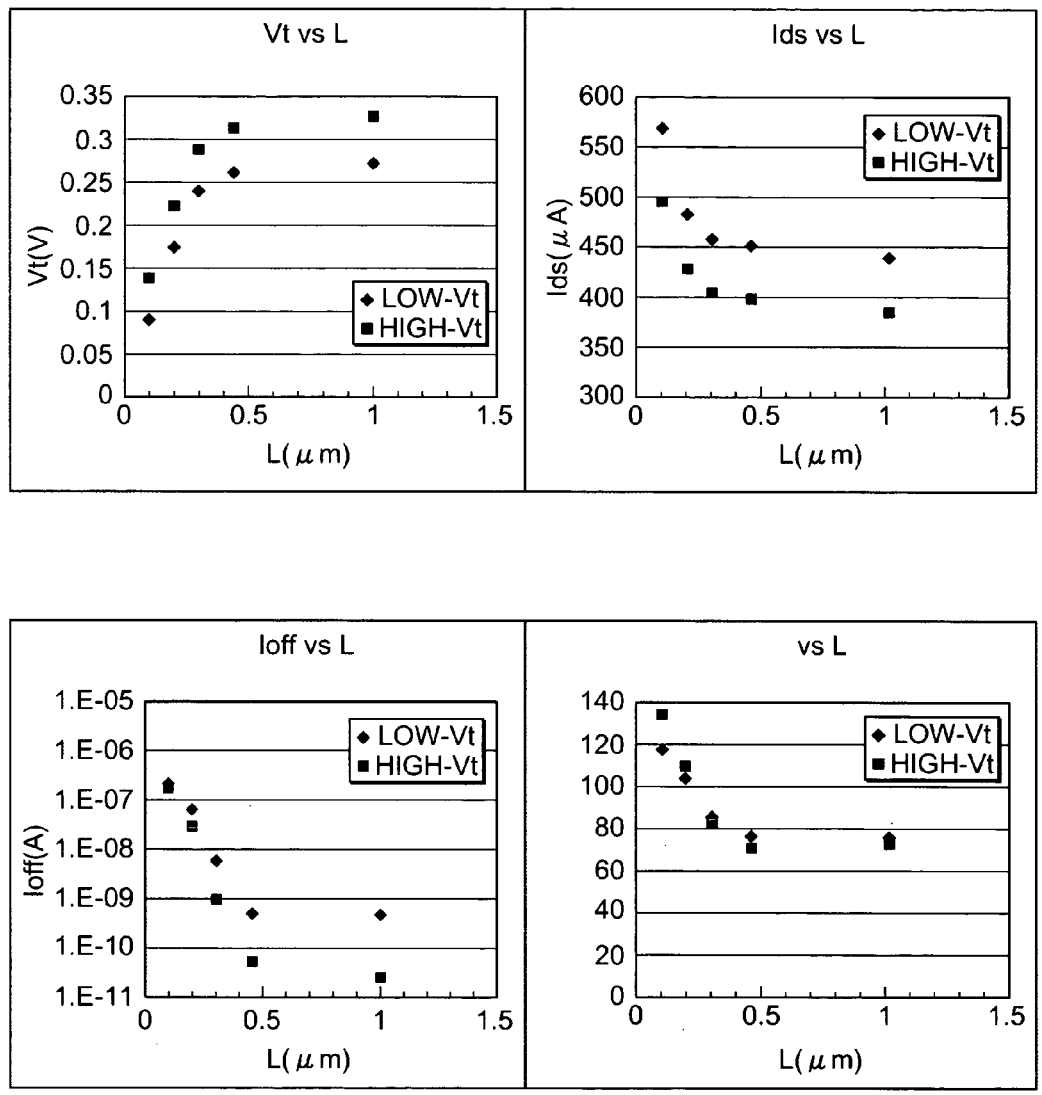
FIG. 2 is a characteristic diagram showing characteristics (Vt, Ids, Ioff and S values) relative to an interval between an active region and a gate of the semiconductor device according to the embodiment of the present invention.

FIG. 2 shows the results of plotting of a threshold voltage Vt, a drain current Id, a leak current Ioff and an S value with respect to an interval L. As evaluating devices used in measurement, NMOS transistors each having a gate length of 0.2 μm and a gate width of 0.4 μm are formed on an SOI substrate, and transistors set at an interval L ranging from about 0.1 μm to 1 μm are measured.

When the active region is being bent even if the gate length and the width (gate width) of the active region are of the same designed value as shown in FIG. 2, the transistor characteristics greatly vary when the interval L is small. When the interval L reaches about 0.4 m or more, the threshold voltage Vt and the drain current Ids do not depend on the interval L (characteristic line becomes horizontal) and hence the characteristic become constant.

In this case, the interval of about 0.4 m can be judged to be the minimum pattern interval that does not influence the transistor characteristics. That is, it is understood that as to the device designed under the 0.2 μm design rule, variations in the transistor characteristics are less reduced if the interval between the active region and the gate is set to about 0.4 μm or more.

Thus, the transistor in which the pattern for the active region or gate is bent, is capable of setting the interval between the active region and the gate to such an interval as not to be affected by the curved portion of the bent pattern and reducing the difference between each of spice parameters high in accuracy and an actual circuit characteristic.

Since a parasitic transistor is formed at the end of an active region particularly when MOS transistors are formed on an SOI wafer using a LOCOS method to fabricate a semiconductor integrated circuit, it is greatly subject to a bent portion of the active region. However, the interval between the gate and the active region is set to a suitable interval to thereby allow the difference between a transistor characteristic and a spice parameter to be reduced more effectively.

While the preferred embodiment of the present invention has been described with reference to the accompanying drawings, it is needless to say that the present invention is not limited to the embodiment. It will be apparent to those skilled in the art that various changes and modifications can be supposed to be made to the invention within the scope described in the following claims. It is to be understood that those changes and modifications fall within the technical scope of the present invention.

Although the present embodiment has explained the transistor formed on the SOI wafer, a similar advantageous effect can be expected even in the case where a transistor is formed on an SOS (Silicon On Sapphire) substrate in which a silicon layer is formed on a sapphire substrate used as an insulator, or a normal bulk substrate.

The present invention is applicable to a semiconductor device and a method of evaluating the semiconductor device, and particularly to a semiconductor device capable of obtaining a characteristic with no difference from a design value in a MOS transistor having such a pattern that an active region or a gate is bent, and a method of evaluating the semiconductor device.

What is claimed is:

1. A semiconductor device comprising:
    an active layer, said active layer being provided with a first portion and a second portion arranged substantially at right angles with each other and connected by an arcuate curved portion therebetween, said arcuate curved portion having an arc radius; and
    a gate formed over said first portion of the active layer, said gate being separated from said second portion by a pattern interval,
    wherein said pattern interval is larger than said arc radius of said arcuate curved portion.

2. The semiconductor device according to claim 1, which is an integrated circuit of MOS transistors.

3. The semiconductor device according to claim 2, which is formed in an SOI substrate.

4. The semiconductor device according to claim 3, wherein when pattern design of the integrated circuit of the MOS transistors formed in the SOI substrate is performed based on a 0.2 μm design rule, the pattern interval is about 0.4 μm or more.

5. A semiconductor device comprising:
   an active layer; and
   a gate formed over the active layer, said gate being provided with a first portion and a second portion arranged substantially at right angles with each other and connected by an arcuate curved portion therebetween, said arcuate curved portion having an arc radius, said first portion of said gate overlying said active layer and said second portion being separated from said active layer by an interval,
   wherein said interval is larger than said arc radius of said arcuate curved portion.

6. The semiconductor device according to claim 5, which is an integrated circuit of MOS transistors.

* * * * *